United States Patent
Kwon et al.

(10) Patent No.: US 10,676,570 B2
(45) Date of Patent: Jun. 9, 2020

(54) PHOTOSENSITIVE RESIN COMPOSITION, BLACK PIXEL DEFINING LAYER USING THE SAME AND DISPLAY DEVICE

(71) Applicant: SAMSUNG SDI CO., LTD., Yongin-si, Gyeonggi-do (KR)

(72) Inventors: Chang-Hyun Kwon, Suwon-si (KR); Jinhee Kang, Suwon-si (KR); Heekyoung Kang, Suwon-si (KR); Jiyun Kwon, Suwon-si (KR); Sang Soo Kim, Suwon-si (KR); Chanwoo Kim, Suwon-si (KR); Bumjin Lee, Suwon-si (KR); Junho Lee, Suwon-si (KR); Chungbeum Hong, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 141 days.

(21) Appl. No.: 15/712,663

(22) Filed: Sep. 22, 2017

(65) Prior Publication Data
US 2018/0230269 A1 Aug. 16, 2018

(30) Foreign Application Priority Data
Feb. 16, 2017 (KR) .................. 10-2017-0021056

(51) Int. Cl.
| | | |
|---|---|---|
| *G03F 7/027* | (2006.01) | |
| *G03F 7/037* | (2006.01) | |
| *C08G 73/10* | (2006.01) | |
| *C08G 65/08* | (2006.01) | |
| *C08G 69/44* | (2006.01) | |
| *C08K 5/54* | (2006.01) | |
| *C08F 20/18* | (2006.01) | |
| *C08F 2/46* | (2006.01) | |
| *C08F 2/48* | (2006.01) | |
| *C09D 179/08* | (2006.01) | |
| *H01L 27/32* | (2006.01) | |
| *C08F 218/08* | (2006.01) | |
| *C08F 222/10* | (2006.01) | |

(52) U.S. Cl.
CPC .............. *C08G 73/106* (2013.01); *C08F 2/46* (2013.01); *C08F 2/48* (2013.01); *C08F 218/08* (2013.01); *C08G 69/44* (2013.01); *C08G 73/1039* (2013.01); *C08G 73/1042* (2013.01); *C08G 73/1082* (2013.01); *C08K 5/54* (2013.01); *C09D 179/08* (2013.01); *G03F 7/027* (2013.01); *G03F 7/037* (2013.01); *H01L 27/3246* (2013.01); *C08F 20/18* (2013.01); *C08F 2222/102* (2013.01); *C08F 2222/104* (2013.01); *C08F 2222/1013* (2013.01); *C08G 65/08* (2013.01)

(58) Field of Classification Search
None
See application file for complete search history.

(56) References Cited

U.S. PATENT DOCUMENTS

| | | | | |
|---|---|---|---|---|
| 4,515,887 | A | 5/1985 | Davis | |
| 4,593,977 | A * | 6/1986 | Takamatsu | G02F 1/133711 349/106 |
| 5,122,436 | A * | 6/1992 | Tunney | C08F 283/12 430/281.1 |
| 6,090,525 | A * | 7/2000 | Yuba | C08G 73/1025 430/283.1 |
| 10,146,129 | B2 * | 12/2018 | Kim | G03F 7/0007 |
| 2005/0057789 | A1 * | 3/2005 | Funada | B29C 59/022 359/31 |
| 2008/0220253 | A1 * | 9/2008 | Ohashi | B32B 7/12 428/355 EN |
| 2010/0038606 | A1 * | 2/2010 | Inoue | B82Y 30/00 |
| 2018/0017866 | A1 * | 1/2018 | Kim | G03F 7/0042 |
| 2018/0088465 | A1 * | 3/2018 | Kwon | G03F 7/0007 |
| 2018/0157173 | A1 * | 6/2018 | Kim | G03F 7/0007 |
| 2018/0231889 | A1 * | 8/2018 | Kim | G03F 7/027 |
| 2018/0356729 | A1 * | 12/2018 | Tanigaki | G03F 7/027 |

FOREIGN PATENT DOCUMENTS

| | | | |
|---|---|---|---|
| EP | 1 351 757 | A | 6/2002 |
| JP | 097214 | B2 | 10/1995 |
| JP | 2516276 | B2 | 4/1996 |
| JP | 2720686 | B2 | 3/1998 |
| JP | 2000-193983 | A | 7/2000 |
| JP | 2006-342310 | A | 12/2006 |
| JP | 2007-212542 | A | 8/2007 |
| JP | 2008-040324 | A | 2/2008 |

(Continued)

OTHER PUBLICATIONS

Office Action dated Jun. 19, 2018, and its accompanying Search Report dated Jun. 15, 2018, of the corresponding Taiwanese Patent Application No. 106132704.

*Primary Examiner* — Martin J Angebranndt
(74) *Attorney, Agent, or Firm* — Lee IP Law, P.C.

(57) ABSTRACT

A photosensitive resin composition, a black pixel defining layer, and a display device, the composition including a binder polymer including a structural unit represented by Chemical Formula 1; a black colorant; a photopolymerizable monomer; a photopolymerization initiator; and a solvent,

[Chemical Formula 1]

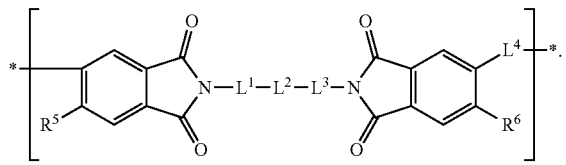

15 Claims, No Drawings

(56) References Cited

FOREIGN PATENT DOCUMENTS

| | | | | | |
|---|---|---|---|---|---|
| JP | 2008-077025 | A | | 4/2008 | |
| JP | 2009-282513 | A | | 12/2009 | |
| JP | 2010-204464 | A | | 9/2010 | |
| JP | 2010-204590 | | * | 9/2010 | ............. G03F 7/038 |
| JP | 2011-195736 | A | | 10/2011 | |
| KR | 10-2015-0007571 | A | | 1/2015 | |
| KR | 10-2017-0001119 | | | 1/2017 | |
| TW | 201122074 | A | | 7/2011 | |
| TW | 201807487 | A | | 3/2018 | |
| WO | 2017/169763 | | * | 10/2017 | ............. G03F 7/037 |

* cited by examiner

PHOTOSENSITIVE RESIN COMPOSITION, BLACK PIXEL DEFINING LAYER USING THE SAME AND DISPLAY DEVICE

CROSS-REFERENCE TO RELATED APPLICATION

Korean Patent Application No. 10-2017-0021056, filed on Feb. 16, 2017, in the Korean Intellectual Property Office, and entitled: "Photosensitive Resin Composition, Black Pixel Defining Layer Using the Same and Display Device," is incorporated by reference herein in its entirety.

BACKGROUND

1. Field

Embodiments relate to a photosensitive resin composition, a black pixel defining layer using the same, and a display device.

2. Description of the Related Art

A photosensitive resin composition may be used to manufacture a color filter, a liquid crystal display material, a display device such as an organic light emitting diode, a display device panel material, and the like. For example, a photosensitive resin film such as a black pixel defining layer may be used on a border between colored layers such as red, green, blue, and the like to help enhance contrast or chromophore effects of a color liquid crystal display or an organic light emitting diode and the like.

SUMMARY

Embodiments are directed to a photosensitive resin composition, a black pixel defining layer using the same, and a display device.

The embodiments may be realized by providing a photosensitive resin composition including a binder polymer including a structural unit represented by Chemical Formula 1; a black colorant; a photopolymerizable monomer; a photopolymerization initiator; and a solvent,

[Chemical Formula 1]

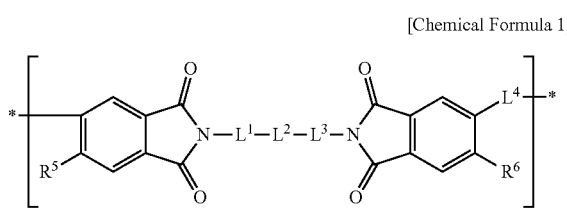

wherein, in Chemical Formula 1, $L^1$, $L^3$, and $L^4$ are each independently *—C(=O)—*, a substituted or unsubstituted C1 to C20 alkylene group, or a substituted or unsubstituted C6 to C20 arylene group, $L^2$ is a linking group represented by Chemical Formula 2, and $R^5$ and $R^6$ are each independently a hydrogen atom or a carboxyl group,

[Chemical Formula 2]

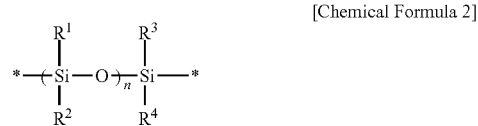

wherein, in Chemical Formula 2, $R^1$ to $R^4$ are each independently a substituted or unsubstituted C1 to C20 alkyl group or a substituted or unsubstituted C6 to C20 aryl group, and n is an integer of 1 to 10.

$L^1$ and $L^3$ may each independently be an unsubstituted C1 to C20 alkylene group or an unsubstituted C6 to C20 arylene group, $L^4$ may be a C1 to C20 alkylene group substituted with a trifluoromethyl group, and $R^5$ and $R^6$ may each be a hydrogen atom.

$L^1$ and $L^3$ may each independently be an unsubstituted C1 to C20 alkylene group or an unsubstituted C6 to C20 arylene group, $L^4$ may be *—C(=O)—*, and $R^5$ and $R^6$ may be a carboxyl group.

The binder polymer may further include a structural unit represented by one of Chemical Formula 3 to Chemical Formula 5:

[Chemical Formula 3]

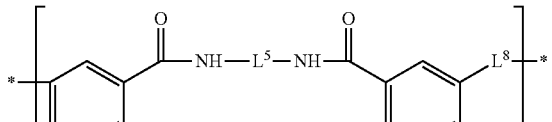

[Chemical Formula 4]

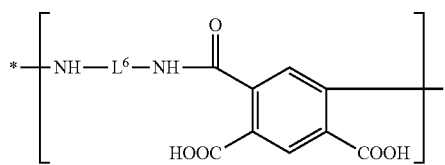

[Chemical Formula 5]

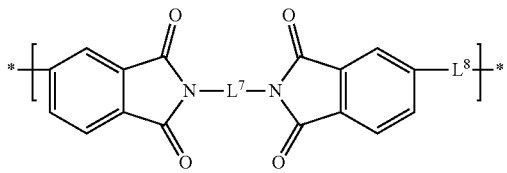

wherein, in Chemical Formula 3 to Chemical Formula 5, $L^5$ to $L^7$ may each independently be a linking group represented by Chemical Formula 2, Chemical Formula 6, or Chemical Formula 7, and $L^8$ may be *—C(=O)—* or a substituted or unsubstituted C1 to C20 alkylene group.

[Chemical Formula 2]

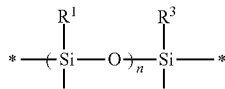

[Chemical Formula 6]

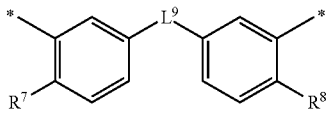

[Chemical Formula 7]

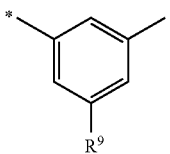

wherein, in Chemical Formula 2, Chemical Formula 6 and Chemical Formula 7, $R^1$ to $R^4$ may each independently be a substituted or unsubstituted C1 to C20 alkyl group or a substituted or unsubstituted C6 to C20 aryl group, n may be an integer of 1 to 10, $L^9$ may be *—S(=O)$_2$—* or *—C(CF$_3$)$_2$—*, and $R^7$ to $R^9$ may each independently be a hydroxy group or a carboxyl group.

The binder polymer may include a functional group represented by one of Chemical Formula 8-1 to Chemical Formula 8-4:

[Chemical Formula 8-1]

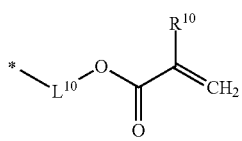

[Chemical Formula 8-2]

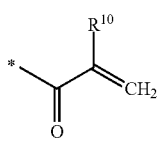

[Chemical Formula 8-3]

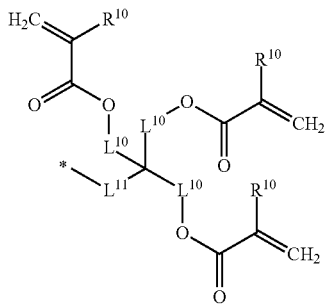

[Chemical Formula 8-4]

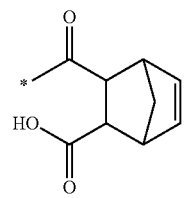

wherein, in Chemical Formula 8-1 to Chemical Formula 8-4, $L^{10}$ and $L^{11}$ may each independently be a substituted or unsubstituted C1 to C10 alkylene group, $R^{10}$ may be a hydrogen atom or a substituted or unsubstituted C1 to C10 alkyl group, and * is a binding site.

The binder polymer may include a structural unit represented by one of Chemical Formula 9 to Chemical Formula 12:

[Chemical Formula 9]

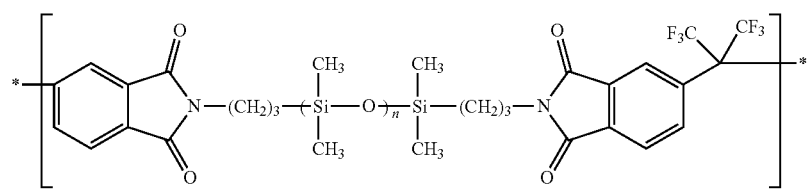

[Chemical Formula 10]

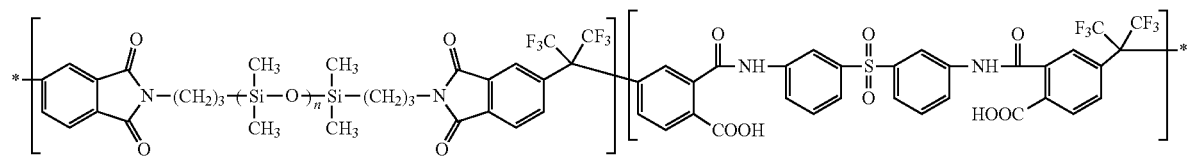

[Chemical Formula 11]

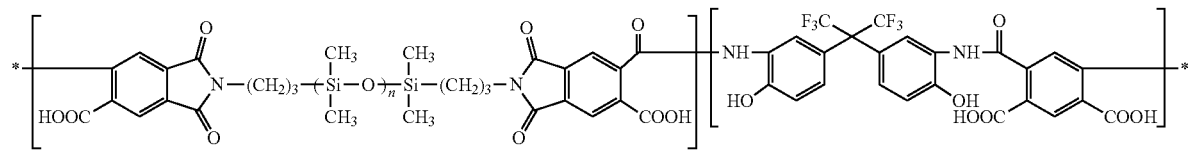

[Chemical Formula 12]

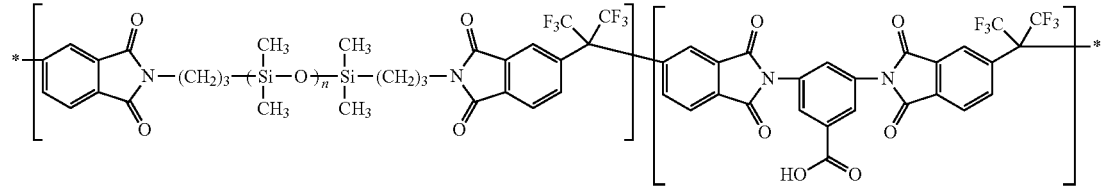

wherein, in Chemical Formula 9 to Chemical Formula 12, n may be an integer of 1 to 10.

The binder polymer has a weight average molecular weight of about 5,000 g/mol to about 20,000 g/mol.

The photosensitive resin composition may further include a cardo binder resin.

The black colorant may include an inorganic black pigment, an organic black pigment, or a combination thereof.

The photopolymerizable monomer may include a compound including at least two functional groups represented by Chemical Formula 13:

[Chemical Formula 13]

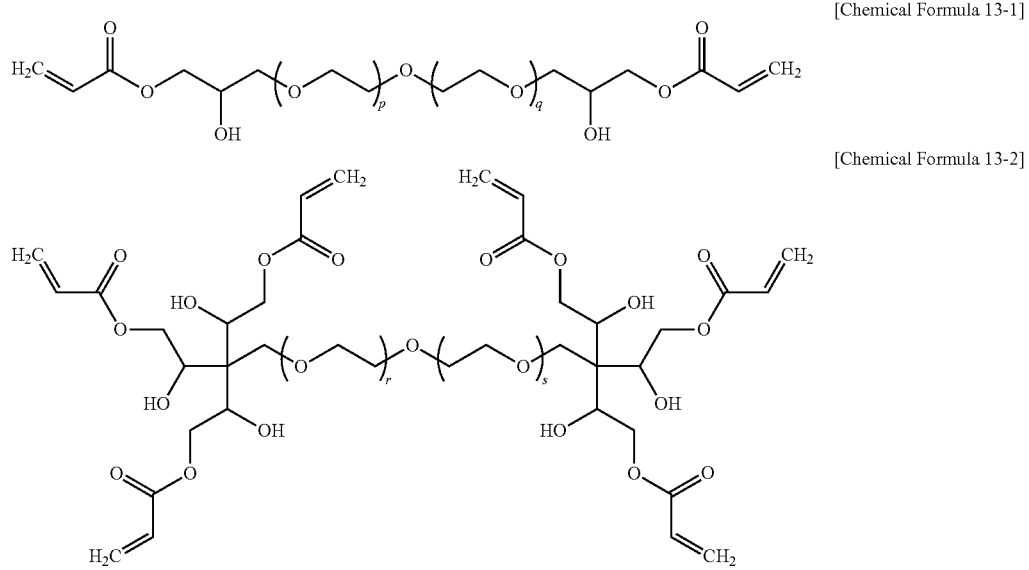

wherein, in Chemical Formula 13, $R^0$ may be a hydrogen atom or a substituted or unsubstituted C1 to C10 alkyl group, $L^{12}$ may be a single bond or a substituted or unsubstituted C1 to C10 alkylene group, and * is a binding site.

The compound including at least two functional groups represented by Chemical Formula 13 may be a compound represented by Chemical Formula 13-1 or Chemical Formula 13-2:

wherein, in Chemical Formula 13-1 and Chemical Formula 13-2, p, q, r, and s may each independently be an integer of 1 to 10.

The photosensitive resin composition may include about 1 wt % to about 30 wt % of the binder polymer; about 1 wt % to about 25 wt % of the black colorant; about 0.5 wt % to about 20 wt % of the photopolymerizable monomer; about 0.1 wt % to about 5 wt % of the photopolymerization initiator; and the solvent, all wt % being based on a total weight of the photosensitive resin composition.

The photosensitive resin composition may further include malonic acid, 3-amino-1,2-propanediol, a silane-based coupling agent, a surfactant, a radical polymerization initiator, or a combination thereof.

The embodiments may be realized by providing a black pixel defining layer manufactured using the photosensitive resin composition according to an embodiment.

The embodiments may be realized by providing a display device including the black pixel defining layer according to an embodiment.

The display device may be an organic light emitting diode (OLED) display device.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group refers" to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, "substituted" refers to replacement of at least one hydrogen atom by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when specific definition is not otherwise provided, "hetero" refers to inclusion of at least one heteroatom of N, O, S, and P in chemical formulae.

As used herein, when specific definition is not otherwise provided, "(meth)acrylate" refers to both "acrylate" and "methacrylate", and "(meth)acrylic acid" refers to "acrylic acid" and "methacrylic acid".

As used herein, when a definition is not otherwise provided, the term "combination" refers to mixing or copolymerization. In addition, "copolymerization" refers to block copolymerization to random copolymerization, and "copolymer" refers to a block copolymer to a random copolymer.

In chemical formulae of the present specification, unless a specific definition is otherwise provided, hydrogen is bonded at the position when a chemical bond is not drawn where supposed to be given.

As used herein, a cardo resin or cardo-based resin refers to a resin including at least one functional group selected from Chemical Formula 14-1 to Chemical Formula 14-11 in a backbone.

As used herein, when specific definition is not otherwise provided, "*" indicates a point where the same or different atom or chemical formula is linked.

A photosensitive resin composition according to an embodiment may include, e.g., (A) a binder polymer or binder resin including a structural unit represented by Chemical Formula 1; (B) a black colorant; (C) a photopolymerizable monomer; (D) a photopolymerization initiator; and (E) a solvent.

[Chemical Formula 1]

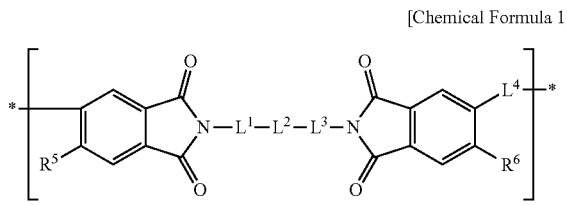

In Chemical Formula 1, $L^1$, $L^3$, and $L^4$ may each independently be or include, e.g., *—C(=O)—*, a substituted or unsubstituted C1 to C20 alkylene group or a substituted or unsubstituted C6 to C20 arylene group, $L^2$ may be, e.g., a linking group represented by Chemical Formula 2, and $R^5$ and $R^6$ may each independently be, e.g., a hydrogen atom or a carboxyl group.

[Chemical Formula 2]

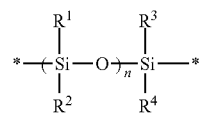

In Chemical Formula 2, $R^1$ to $R^4$ may each independently be or include, e.g., a substituted or unsubstituted C1 to C20 alkyl group or a substituted or unsubstituted C6 to C20 aryl group, and n may be, e.g., an integer of 1 to 10.

A polyimide (or its precursor) resin used alone as a binder resin for a photosensitive resin composition may be classified into a positive type (in which an exposed region is dissolved through development) and a negative type (in which the exposed region is cured and remains). When the photosensitive resin composition includes a black colorant, the positive type resin may have a reduction in realizing a fine pattern due to reduced transmittance of ultraviolet (UV). In addition, the polyimide (or its precursor) resin as the negative type may have high dissolubility or insolubility (e.g., lower or no solubility) about or in an alkali aqueous solution and may have a limit in using the binder resin alone.

The photosensitive resin composition according to an embodiment may use a binder resin including the structural unit represented by Chemical Formula 1 and thus may be insoluble in an organic solvent, may have excellent solubility in an alkali aqueous solution, and high heat resistance.

For example, a negative-type photosensitive resin capable of adjusting solubility in an alkali aqueous solution as a developing solution, through controlling a ratio of applying an imidized structure in the binder resin structure and simultaneously, realizing an excellent fine pattern by introducing a cross-linkable functional group at the end of the main structure by a photopolymerization initiator to apply cross-linking characteristics through exposure of the binder resin itself may be realized. In this way, the photosensitive resin composition may have appropriate solubility in the alkali aqueous solution through adjusting a copolymerization ratio between a soluble imide structure and a polyimide (or its precursor (e.g., amic acid)) structure and excellent heat resistance by introducing a cross-linkable functional group at the end of a polymer (a binder resin) to cross-link an exposed region through UV irradiation, forming a non-exposed region into a fine pattern through development, and thermally curing the pattern at greater than or equal to about 350° C. (a 1 wt % loss temperature of greater than or equal to about 350° C. through a TGA analysis).

Hereinafter, each component is specifically described.

(A) Binder Polymer

In an implementation, in Chemical Formula 1, $L^1$ and $L^3$ may each independently be, e.g., an unsubstituted C1 to C20 alkylene group or an unsubstituted C6 to C20 arylene group, $L^4$ may be, e.g., a C1 to C20 alkylene group substituted with a trifluoromethyl group, and $R^5$ and $R^6$ may each be, e.g., a hydrogen atom.

In an implementation, in Chemical Formula 1, $L^1$ and $L^3$ may each independently be or include, e.g., an unsubstituted C1 to C20 alkylene group or an unsubstituted C6 to C20 arylene group, $L^4$ may be, e.g., *—C(=O)—*, and $R^5$ and $R^6$ may each be, e.g., a carboxyl group.

In an implementation, the binder polymer may further include a structural unit represented by one of Chemical Formula 3 to Chemical Formula 5 in addition to the structural unit represented by Chemical Formula 1, which may further improve developability and heat resistance.

[Chemical Formula 3]

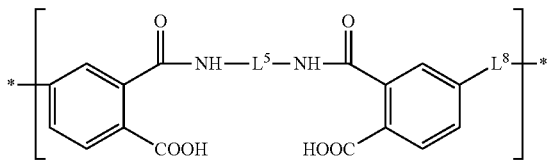

[Chemical Formula 4]

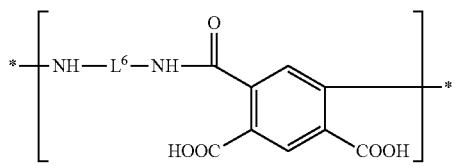

[Chemical Formula 5]

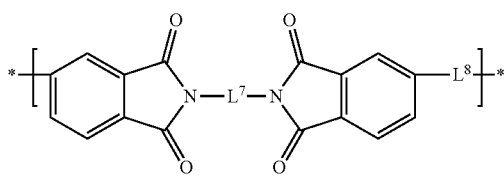

In Chemical Formula 3 to Chemical Formula 5, $L^5$ to $L^7$ may each independently be, e.g., a linking group represented by Chemical Formula 2, Chemical Formula 6, or Chemical Formula 7, and $L^8$ may be or may include, e.g., *—C(=O)—* or a substituted or unsubstituted C1 to C20 alkylene group,

[Chemical Formula 2]

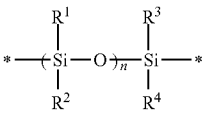

[Chemical Formula 6]

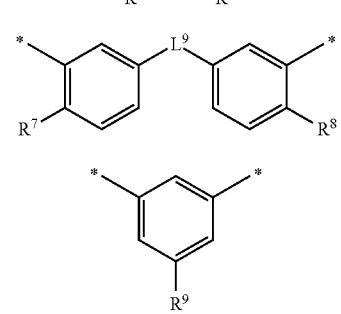

[Chemical Formula 7]

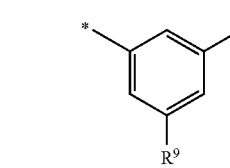

In Chemical Formula 2, Chemical Formula 6, and Chemical Formula 7, $R^1$ to $R^4$ may each independently be or include, e.g., a substituted or unsubstituted C1 to C20 alkyl group or a substituted or unsubstituted C6 to C20 aryl group, n may be, e.g., an integer of 1 to 10, $L^9$ may be, e.g., *—S(=O)$_2$—* or *—C(CF$_3$)$_2$—*, and $R^7$ to $R^9$ may each independently be, e.g., a hydroxy group or a carboxyl group.

In an implementation, the binder polymer may include a cross-linkable functional group at the terminal end. In an implementation, the cross-linkable functional group may be represented by one of, e.g., Chemical Formula 8-1 to Chemical Formula 8-4.

[Chemical Formula 8-1]

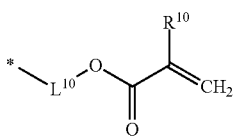

[Chemical Formula 8-2]

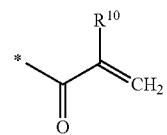

[Chemical Formula 8-3]

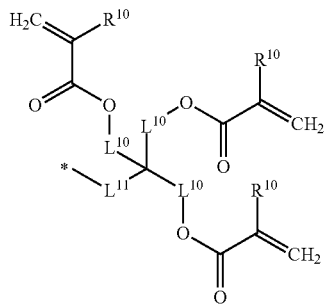

[Chemical Formula 8-4]

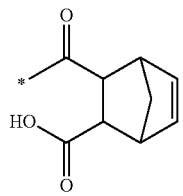

In Chemical Formula 8-1 to Chemical Formula 8-4, $L^{10}$ and $L^{11}$ may each independently be or include, e.g., a substituted or unsubstituted C1 to C10 alkylene group, and $R^{10}$ may be or may include, e.g., a hydrogen atom or a substituted or unsubstituted C1 to C10 alkyl group.

In an implementation, the binder polymer may include a structural unit represented by one of Chemical Formula 9 to Chemical Formula 12. In the structural units below, the different moieties enclosed by different brackets may be repeated and/or rearranged in any order in the structural unit, and not necessarily included in the illustrated, alternating order.

[Chemical Formula 9]

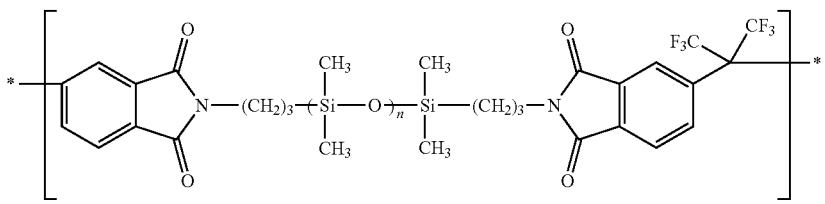

[Chemical Formula 10]

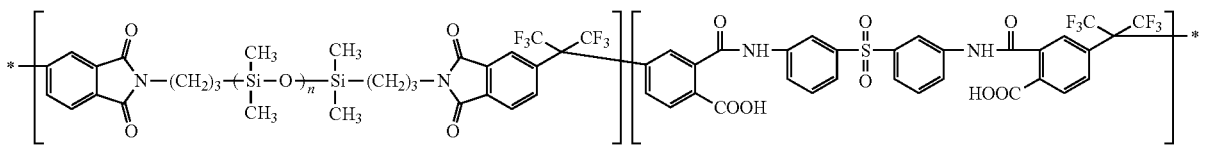

[Chemical Formula 11]

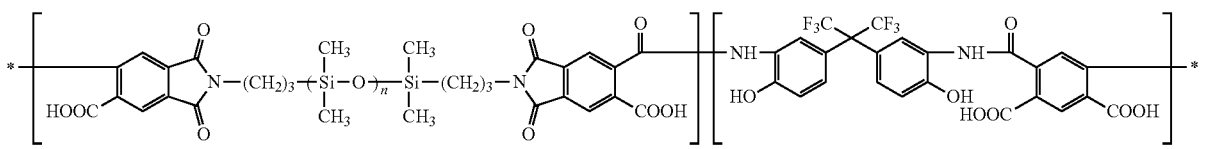

[Chemical Formula 12]

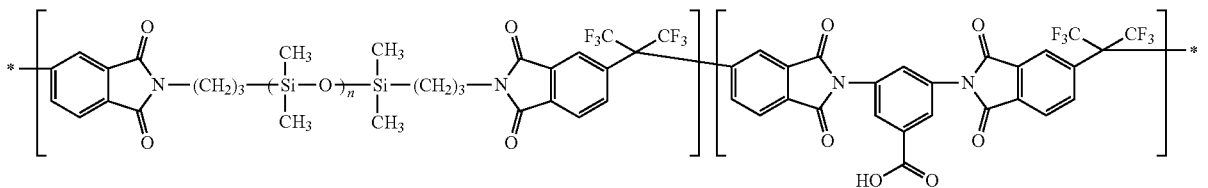

In Chemical Formula 9 to Chemical Formula 12, n may be, e.g., an integer of 1 to 10.

The binder polymer including the structural unit represented by Chemical Formula 1 may have a weight average molecular weight of about 5,000 g/mol to about 20,000 g/mol. When the binder polymer has a weight average molecular weight within the ranges, excellent pattern-forming capability may be obtained, and a thin film may having excellent mechanical thermal characteristics may be provided.

A photosensitive resin composition according to an embodiment may further include a cardo binder resin as a binder resin.

In an implementation, the cardo binder resin may include a structural unit represented by Chemical Formula 14.

[Chemical Formula 14]

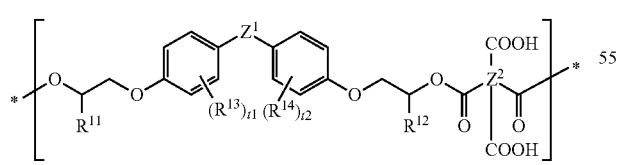

In Chemical Formula 14, $R^{11}$ and $R^{12}$ may each independently be or include, e.g., a hydrogen atom or a substituted or unsubstituted (meth)acryloyloxy alkyl group.

$R^{13}$ and $R^{14}$ may each independently be or include, e.g., a hydrogen atom, a halogen atom, or a substituted or unsubstituted C1 to C20 alkyl group, and $Z^1$ may be, e.g., a single bond, O, CO, $SO_2$, $CR^{17}R^{18}$, $SiR^{19}R^{20}$ (in which $R^{17}$ to $R^{20}$ may each independently be or include, e.g., a hydrogen atom or a substituted or unsubstituted C1 to C20 alkyl group), or a linking group represented by one of the following Chemical Formula 14-1 to Chemical Formula 14-11.

[Chemical Formula 14-1]

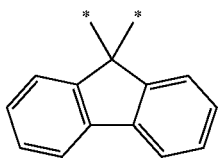

[Chemical Formula 14-2]

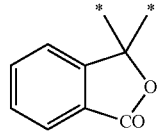

[Chemical Formula 14-3]

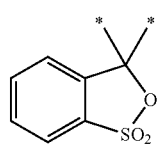

[Chemical Formula 14-4]

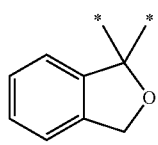

[Chemical Formula 14-5]

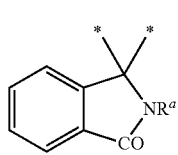

In Chemical Formula 14-5,
$R^a$ may be, e.g., a hydrogen atom, an ethyl group, $C_2H_4Cl$, $C_2H_4OH$, $CH_2CH=CH_2$, or a phenyl group.

[Chemical Formula 14-6]

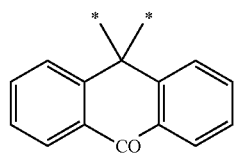

[Chemical Formula 14-7]

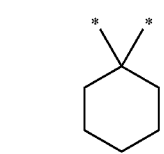

[Chemical Formula 14-8]

[Chemical Formula 14-9]

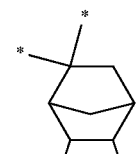

[Chemical Formula 14-10]

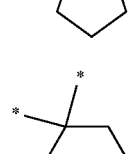

[Chemical Formula 14-11]

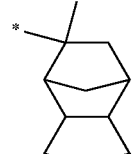

$Z^2$ may be, e.g., an acid anhydride residual group, and t1 and t2 may each independently be, e.g., an integer of 0 to 4.

A weight average molecular weight of the cardo binder resin may be about 500 g/mol to about 50,000 g/mol, e.g. about 1,000 g/mol to about 30,000 g/mol. When the cardo binder resin a weight average molecular weight within the range, a pattern may be well formed without a residue during manufacture of a photosensitive organic film and without loss of a film thickness during development.

The cardo binder resin may include a functional group represented by Chemical Formula 15 at one or more (e.g., both) terminal ends thereof.

[Chemical Formula 15]

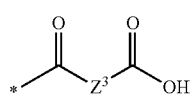

In Chemical Formula 15, $Z^3$ may be a linking group represented by one of Chemical Formula 15-1 to Chemical Formula 15-7.

[Chemical Formula 15-1]

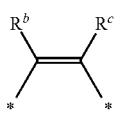

In Chemical Formula 15-1, $R^b$ and $R^c$ may each independently be or include, e.g., a hydrogen atom, a substituted or unsubstituted C1 to C20 alkyl group, an ester group, or ether group.

[Chemical Formula 15-2]

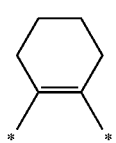

[Chemical Formula 15-3]

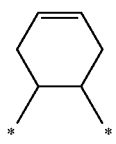

[Chemical Formula 15-4]

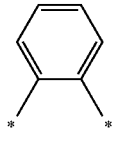

[Chemical Formula 15-5]

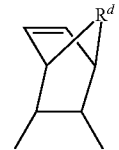

In Chemical Formula 15-5, $R^d$ may be or may include, e.g., O, S, NH, a substituted or unsubstituted C1 to C20 alkylene group, a C1 to C20 alkylamine group, or a C2 to C20 alkenylamine group.

[Chemical Formula 15-6]

[Chemical Formula 15-7]

The cardo resin may be prepared, e.g., by mixing at least two of, a fluorene-containing compound (such as 9,9-bis(4-oxiranylmethoxyphenyl)fluorene, or the like); an anhydride compound (such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, or the like); a glycol compound (such as ethylene glycol, propylene glycol, polyethylene glycol, or the like); an alcohol compound (such as methanol, ethanol, propanol, n-butanol, cyclohexanol, benzylalcohol, or the like); a solvent-based compound (such propylene glycol methylethylacetate, N-methylpyrrolidone, or the like); a phosphorus compound (such as triphenylphosphine or the like); and an amine or ammonium salt compound (such as tetramethylammonium chloride, tetraethylammonium bromide, benzyldiethylamine, triethylamine, tributylamine, benzyltriethylammonium chloride, or the like).

When the photosensitive resin composition according to an embodiment includes the cardo binder resin in addition to the binder polymer including the structural unit represented by Chemical Formula 1, developability may be improved and fine pattern-forming capability may be further improved due to good sensitivity during photo-curing.

The binder polymer may be included in the composition in an amount of about 1 wt % to about 30 wt % for example about 10 wt % to about 20 wt %, based on a total weight of the photosensitive resin composition. When the binder polymer is included within the range, sensitivity, developability, resolution, and linearity of a pattern may be improved.

(B) Black Colorant

The black colorant in the photosensitive resin composition according to an embodiment may include, e.g., an inorganic black pigment, an organic black pigment, or a combination thereof in order to help improve light-blocking properties and easily realize black. A black pigment by color mixing RGB black or the like may be used alone or as a mixture. For example, the black colorant may include aniline black, perylene black, titanium black, cyanine black, lignin black, lactam-based organic black, RGB black, carbon black, or a combination thereof. The RGB black refers to a pigment showing black by mixing at least two color (not black) pigments of a red pigment, a green pigment, a blue pigment, a violet pigment, a yellow pigment, a purple pigment, and the like. In an implementation, the organic black pigment may include, e.g., a lactam organic black represented by Chemical Formula A.

[Chemical Formula A]

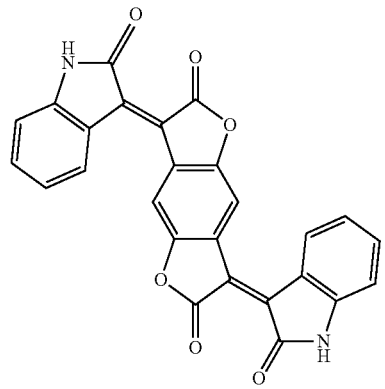

When the black colorant is the organic black pigment or a mixture of the organic black pigment and carbon black that is an inorganic black pigment, a dispersing agent may be used therewith to disperse the pigment. For example, the pigment may be pretreated with the dispersing agent on the surface or the dispersing agent may be added with the pigment during preparation of a composition.

The dispersing agent may be a non-ionic dispersing agent, an anionic dispersing agent, a cationic dispersing agent, or the like. Examples of the dispersing agent may include polyalkylene glycol and esters thereof, polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, alkyl amine, and the like, and these may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001 made by BYK Co., Ltd.; EFKA-47, EFKA-47EA, EFKA-48, EFKA-49, EFKA-100, EFKA-400, EFKA-450 made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, PB821, and the like made by Ajinomoto Inc.

The dispersing agent may be included in an amount of about 0.1 wt % to about 15 wt %, based on the total weight of the photosensitive resin composition. When the dispersing agent is included within the range, the composition has excellent stability, developability, and pattern-forming capability due to improved dispersion properties during manufacture of a black defining layer material.

The pigment may be pre-treated using a water-soluble inorganic salt and a wetting agent. When the pigment is pre-treated, an average particle diameter of the pigment may become finer.

The pre-treatment may be performed by kneading the pigment with a water-soluble inorganic salt and a wetting agent and then, filtering and washing the knead pigment.

The kneading may be performed at a temperature of about 40° C. to about 100° C., and the filtering and washing may be performed by filtering the pigment after washing away an inorganic salt with water and the like.

Examples of the water-soluble inorganic salt may include sodium chloride, potassium chloride, and the like. The wetting agent may facilitate uniform mixing of the pigment with the water-soluble inorganic salt and be pulverized. Examples of the wetting agent may include alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used alone or as a mixture of two or more.

The pigment (after the kneading) may have an average particle diameter of about 5 nm to about 200 nm, e.g., about 5 nm to about 150 nm. When the pigment has an average particle diameter within the range, stability of pigment dispersion liquid may be improved and pixel resolution may not be deteriorated.

In an implementation, the pigment may be used in a form of pigment dispersion liquid including the dispersing agent and a solvent which will be described later, and the pigment dispersion liquid may include a solid pigment, a dispersing agent, and a solvent. The solid pigment may be included in an amount of about 5 wt % to about 40 wt %, e.g., about 8 wt % to about 30 wt %, based on a total weight of the pigment dispersion liquid.

The black colorant may be included (e.g., in a solid content) in an amount of about 1 wt % to about 25 wt %, e.g., about 2 wt % to about 10 wt %, based on a total weight of the photosensitive resin composition. For example, the black colorant may be included in an amount of about 5 wt % to about 70 wt % for a reference of the pigment dispersion liquid based on a total amount of the photosensitive resin composition. When the black colorant is included within the range, coloring effects and development performance may be improved.

(C) Photopolymerizable Monomer

The photopolymerizable monomer in the photosensitive resin composition according to an embodiment may be a single compound or a mixture of two or more different kinds of compounds.

The photopolymerizable monomer may be or include a compound including at least two functional groups represented by Chemical Formula 13.

[Chemical Formula 13]

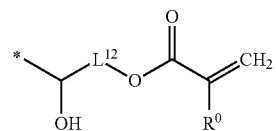

In Chemical Formula 13, $R^0$ may be or may include, e.g., a hydrogen atom or a substituted or unsubstituted C1 to C10 alkyl group, and $L^{12}$ may be or may include, e.g., a single bond or a substituted or unsubstituted C1 to C10 alkylene group.

In an implementation, the compound including at least two functional groups represented by Chemical Formula 13 may include 2 to 6 functional groups represented by Chemical Formula 13. In this case, during exposure of a pattern forming process, sufficient polymerization may occur and a pattern having improved heat resistance, light resistance, and chemical resistance may be formed.

In an implementation, the compound including at least two functional groups represented by Chemical Formula 13 may be a compound represented by Chemical Formula 13-1 or Chemical Formula 13-2.

[Chemical Formula 13-1]

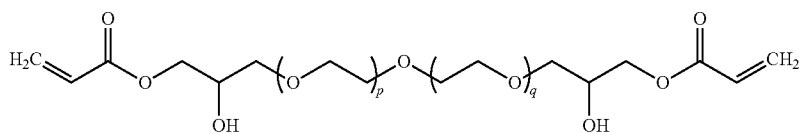

[Chemical Formula 13-2]

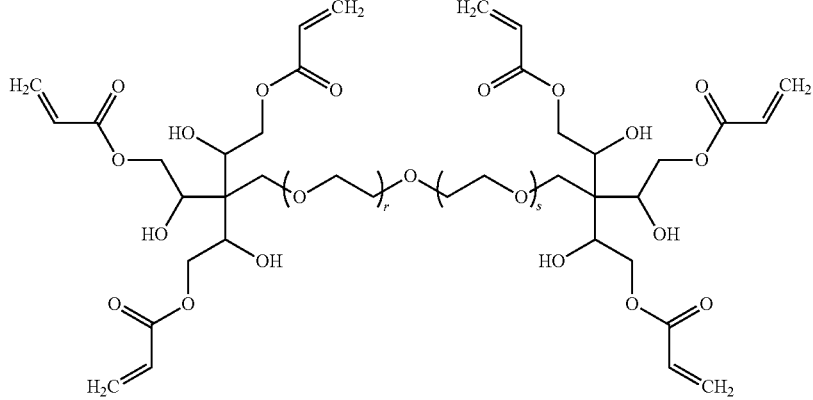

In Chemical Formula 13-1 and Chemical Formula 13-2, p, q, r, and s may each independently be, e.g., an integer of to 10.

The photopolymerizable monomer may be or may include, e.g., a monofunctional or multi-functional ester compound of (meth)acrylic acid having at least one ethylenic unsaturated double bond.

The monofunctional or multi-functional ester compound of the (meth)acrylic acid having at least one ethylenic unsaturated double bond may include, e.g., ethylene glycol di(meth)acrylate, diethylene glycol di(meth)acrylate, triethylene glycol di(meth)acrylate, propylene glycol di(meth)acrylate, neopentylglycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritoltri(meth)acrylate, pentaerythritoltetra(meth)acrylate, pentaerythritol hexa(meth)acrylate, dipentaerythritol di(meth)acrylate, dipentaerythritoltri(meth)acrylate, dipentaerythritolpenta(meth)acrylate, dipentaerythritol hexa(meth)acrylate, bisphenol A epoxy(meth)acrylate, ethylene glycolmonomethylether (meth)acrylate, trimethylolpropanetri(meth)acrylate, tris(meth)acryloyloxyethyl phosphate, novolac epoxy (meth)acrylate, or a combination thereof.

Commercially available examples of the monofunctional or multi-functional ester compound of the (meth)acrylic acid having at least one ethylenic unsaturated double bond are as follows. Examples of the mono-functional (meth)acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. The products may be used alone or as a mixture of two or more.

The photopolymerizable monomer may be treated with acid anhydride to help improve developability.

The photopolymerizable monomer may be included in an amount of about 0.5 wt % to about 20 wt %, e.g., about 1 wt % to about 10 wt %, based on a total weight of the photosensitive resin composition. When the photopolymerizable monomer is included within the ranges, the reactive unsaturated compound is sufficiently cured during exposure in a pattern-forming process and has excellent reliability and thus, may form a pattern having improved heat resistance, light resistance, and chemical resistance and also, excellent resolution and close-contacting properties.

(D) Photopolymerization Initiator

A photosensitive resin composition according to an embodiment may include a photopolymerization initiator. The photopolymerization initiator may include, e.g., an acetophenone-based compound, a benzophenone-based compound, a thioxanthone-based compound, a benzoin-based compound, a triazine-based compound, an oxime-based compound, or the like.

Examples of the acetophenone-based compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may include thioxanthone, 2-chlorothioxanthone, 2-methylthioxanthone, isopropyl thioxanthone, 2,4-diethyl thioxanthone, 2,4-diisopropyl thioxanthone, and the like.

Examples of the benzoin-based compound may include benzoin, benzoin methyl ether, benzoin ethyl ether, benzoin isopropyl ether, benzoin isobutyl ether, benzyldimethylketal, and the like.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-metboxynaphthyl)-4,6-bis(trichloromethyl)-s-triazine, 2-(p-methoxyphenyl)-4,6-bis (trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho-1-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis (trichloromethyl)-6-(4-methoxystyryl)-s-triazine, and the like.

Examples of the oxime-based compound may include an O-acyloxime-based compound, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyloxime-based compound may include 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-one oxime-O-acetate, 1-(4-phenylsulfanyl phenyl)-butan-1-oneoxime-O-acetate, and the like.

The photopolymerization initiator may further include. e.g., a carbazole-based compound, a diketone-based compound, a sulfonium borate-based compound, a diazo-based compound, an imidazole-based compound, a biimidazole-based compound, a fluorene-based compound, or the like, in addition to the compounds described above.

The photopolymerization initiator may be included in an amount of about 0.1 wt % to about 5 wt %, e.g., about 1 wt % to about 3 wt %. based on the total weight of the photosensitive resin composition. When the photopolymerization initiator is included within the range, the composition may be sufficiently photopolymerized when exposed to light during the pattern-forming process for preparing a black pixel defining layer, accomplishing excellent sensitivity and improving transmittance.

(E) Solvent

The solvent may be a material having compatibility with the binder polymer, the pigment dispersion liquid including the black colorant, the photopolymerizable monomer, and the photopolymerization initiator, but not reacting therewith.

Examples of the solvent may include alcohols such as methanol, ethanol, and the like; ethers such as dichloroethylether, n-butylether, diisoamylether, methylphenylether, tetrahydrofuran, and the like; glycolethers such as ethylene glycolmonomethylether, ethylene glycolmonoethylether, ethylene glycoldimethylether, and the like; cellosolve acetates such as methylcellosolveacetate, ethylcellosolveacetate, diethylcellosolveacetate, and the like; carbitols such as methylethylcarbitol, diethylcarbitol, diethylene glycolmonomethylether, diethylene glycolmonoethylether, diethylene glycoldimethylether, diethylene glycolethyhnethylether, diethylene glycoldiethylether, and the like; propylene glycolalkyletheracetates such as propylene glycolmethyletheracetate, propylene glycolpropyletheracetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxyacetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxypropionic acid alkyl esters such as 3-oxymethyl propionate, 3-oxyethyl propionate, and the like; 3-alkoxy propionic acid alkyl esters such as 3-methoxymethyl propionate, 3-methoxyethyl propionate, 3-ethoxyethyl propionate, 3-ethoxymethyl propionate, and the like; 2-oxypropionic acid alkyl esters such as 2-oxymethyl propionate, 2-oxyethyl propionate, 2-oxy propyl propionate, and the like; 2-alkoxypropionic acid alkyl esters such as 2-methoxymethyl propionate, 2-methoxyethyl propionate, 2-ethoxyethyl propionate, 2-ethoxymethyl propionate, and the like; 2-oxy-2-methylpropionic acid esters such as 2-oxy-2-methylmethyl propionate, 2-oxy-2-methylethyl propionate, and the like; monooxymonocarboxylic acid alkyl esters of 2-alkoxy-2-methylpropionic acid alkyl such as 2-methoxy-2-methylmethyl propionate, 2-ethoxy-2-methylethyl propionate, and the like; esters such as 2-hydroxyethyl propionate, 2-hydroxy-2-methylethyl propionate, hydroxyl ethyl acetate, 2-hydroxy-3-methyl methyl butanoate, and the like; and ketonate esters such as ethyl pyruvate, and the like, and additionally a high boiling point solvent such as N-methylformamide, N,N-dimethyl formamide, N-methylformanilide. N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like.

Considering miscibility and reactivity, glycol ethers such as ethylene glycol monoethylether, ethylene glycol dimethylether, ethylene glycol diethylether, diethylene glycolethylmethylether, and the like; ethylene glycol alkyl ether acetates such as ethyl cellosolve acetate, and the like; esters such as 2-hydroxyethyl propionate, and the like; carbitols such as diethylene glycolmonomethylether, and the like; propylene glycol alkyl ether acetates such as propylene glycolmonomethyl ether acetate, propylene glycolpropyletheracetate, and the like may be used.

In an implementation, the solvent may be included in a balance amount. In an implementation, the solvent may be included in an amount of, e.g., about 30 wt % to about 80 wt %, based on the total weight of the photosensitive resin composition. When the solvent is included within the range, the photosensitive resin composition may have an appropriate viscosity resulting in improvement of coating characteristics of a black pixel defining layer.

(F) Other Additives

In an implementation, the photosensitive resin composition may further include an additive, e.g., malonic acid, 3-amino-1,2-propanediol, a silane coupling agent, a surfactant, a radical polymerization initiator, or a combination thereof.

The silane-based coupling agent may have a reactive substituent of a vinyl group, a carboxyl group, a methacryloxy group, an isocyanate group, an epoxy group, and the like, in order to help improve close-contacting properties with a substrate.

Examples of the silane coupling agent may include trimethoxysilylbenzoic acid, γ-methacryloxypropyltrimethoxysilane, vinyltriacetoxysilane; vinyltrimethoxysilane, γ-isocyanatepropyltriethoxysilane, γ-glycidoxypropyltrimethoxysilane, β-(3,4-epoxycyclohexyl) ethyltrimethoxysilane, and the like. These may be used alone or in a mixture of two or more.

The silane coupling agent may be included in an amount of about 0.01 parts by weight to about 10 parts by weight, based on 100 parts by weight of the photosensitive resin composition. When the silane coupling agent is included within the range, close-contacting properties, storage properties, and the like may be improved.

In an implementation, the photosensitive resin composition may further include a surfactant, e.g., a fluorine surfactant and/or a silicone surfactant, in order to help improve coating properties and prevent a defect.

Examples of the fluorine surfactant may include a commercial fluorine surfactant such as BM-1000®, and BM-1100® (BM Chemie Inc.); MEGAFACE F 142D®, F 172®, F 173®, F 183® and F 554® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.).

The silicone surfactant may include, e.g., BYK-307, BYK-333, BYK-361N, BYK-051, BYK-052, BYK-053, BYK-067A, BYK-077, BYK-301, BYK-322, BYK-325, and the like, which are made by BYK Chem and commercially available.

The surfactant may be included in an amount of about 0.001 to about 5 parts by weight, based on 100 parts by weight of the photosensitive resin composition. When the surfactant is included within the range, excellent wetting on an IZO substrate or a glass substrate as well as coating uniformity may be secured, a stain may not be produced.

In an implementation, the photosensitive resin composition may include other additives such as an antioxidant, a stabilizer, or the like in a predetermined amount unless they deteriorate properties of the photosensitive resin composition.

The photosensitive resin composition according to an embodiment may be either positive or negative but should be negative to completely remove residues in regions where a pattern is exposed after exposing and developing the composition having light-blocking properties.

Another embodiment provides a black pixel defining layer manufactured by exposure, development, and curing of the photosensitive resin composition.

A method of manufacturing the black pixel defining layer is as follows.

(1) Coating and Film Formation

The photosensitive resin composition may be coated to have a desired thickness on a substrate such as a glass substrate or an ITO substrate which undergoes a predetermined pretreatment, using a spin or slit coating, a roll coating method, a screen-printing method, an applicator method, and the like, and may be heated at about 70° C. to about 110° C. for about 1 minute to 10 minutes to remove a solvent, forming a photosensitive resin layer.

(2) Exposure

The photosensitive resin layer may be patterned by disposing a mask and then, radiating an actinic ray ranging from about 200 nm to about 500 nm. The radiating may be performed by using a light source such as a mercury lamp with a low pressure, a high pressure, or an ultrahigh pressure, a metal halide lamp, an argon gas laser, or the like. An X ray, an electron beam, or the like may be also used.

Exposure process may use, e.g., a light dose of about 500 mJ/cm$^2$ or less (with a 365 nm sensor) when a high pressure mercury lamp is used. In an implementation, the light dose may vary depending on kinds of each component, its combination ratio, and a dry film thickness.

(3) Development

After the exposure process, an alkali aqueous solution may be used to develop the exposed film by dissolving and removing an unnecessary part except the exposed part, forming a pattern.

(4) Post-Treatment

The developed image pattern may be post-heated in order to accomplish excellent quality in terms of heat resistance, photo resistance, close contacting properties, crack-resistance, chemical resistance, high strength, storage stability, and the like. For example, after development, heat-treatment may be performed under a nitrogen atmosphere in a convection oven of about 250° C. for about 1 hour.

Another embodiment provides a display device including the black pixel defining layer.

The display device may be an organic light emitting diode (OLED).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES (Synthesis of Binder Polymer)

Synthesis Example 1

12.3 g of 6-FDA (4,4'-(hexafluoroisopropylidene)diphthalic anhydride) was added to 61.5 g of N-methyl-2-pyrrolidone (NMP) and then, dissolved therein in a four-necked flask equipped with a stirrer, a thermostat, a nitrogen gas injector, and a condenser while nitrogen was passed through the flask. When the solid was completely dissolved, 10.2 g of SiDA ([bis(3-aminopropyl)]polydimethylsiloxane) [KR-8010, Shin-Etsu Chemical Co., Ltd.] was added thereto, and the obtained mixture was stirred at ambient temperature for 2 hours. After increasing a temperature up to 90° C., 7.51 g of pyridine and 4.85 g of acetic anhydride (Ac$_2$O) were added thereto, and the obtained mixture was stirred for 3 hours. After decreasing the temperature down to ambient temperature, 0.51 g of 2-hydroxyethylmethacrylate (HEMA) was added thereto, and the obtained mixture was stirred for 6 hours. Subsequently, water was added to the reaction mixture, and a precipitate produced therein was filtered, sufficiently washed with water, and dried at 50° C. under a reduced pressure for greater than or equal to 24 hours to prepare a binder polymer including a structural unit represented by Chemical Formula 9. A weight average molecular weight of the binder polymer was 10,800 g/mol when measured by GPC (Gel Permeation Chromatography) in terms of standard polystyrene, and polydispersity of the binder polymer was 3.28.

[Chemical Formula 9]

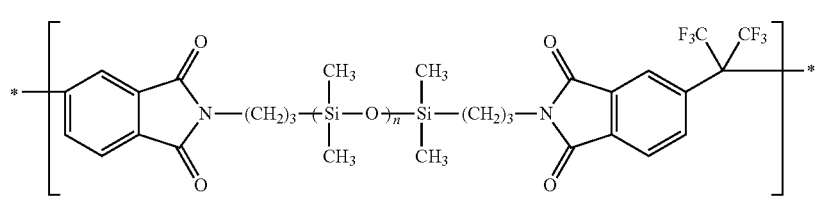

In Chemical Formula 9, n is 8.

Synthesis Example 2

12.3 g of 6-FDA (4,4'-(hexafluoroisopropylidene)diphthalic anhydride) was added to 61.5 g of N-methyl-2-pyrrolidone (NMP) and then, dissolved therein in a four-necked flask equipped with a stirrer, a thermostat, a nitrogen gas injector, and a condenser while nitrogen was passed through the flask. When the solid was completely dissolved, 5.1 g of SiDA ([bis(3-aminopropyl)]polydimethylsiloxane) [KF-8010, Shin-Etsu Chemical Co., Ltd.] was added thereto, and the obtained mixture was stirred at ambient temperature for 2 hours. After increasing a temperature up to 90° C., 3.75 g of pyridine and 2.42 g of acetic anhydride (Ac$_2$O) were added thereto, and the obtained mixture was stirred for 3 hours. After decreasing the temperature down to ambient temperature, 0.51 g of 2-hydroxyethylmethacrylate (HEMA) was added thereto, and the obtained mixture was stirred for 6 hours. Subsequently, 2.95 g of 3-DAS (3-aminophenyl sulfone) was added thereto, and the obtained mixture was reacted for 6 hours, completing the reaction. The reaction mixture was added to water, and a precipitate produced therein was filtered, sufficiently washed with water, and dried at 50° C. under a reduced pressure for greater than or equal to 24 hours to obtain a binder polymer including a structural unit represented by Chemical Formula 10. A weight average molecular weight of the binder polymer was 9,200 g/mol when measured by GPC (Gel Permeation Chromatography) in terms of standard polystyrene, and polydispersity of the binder polymer was 1.86.

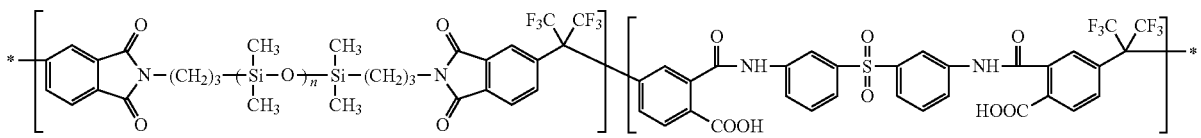

In Chemical Formula 10, n is 8.

Synthesis Example 3

12.3 g of 6-FDA (4,4'-(hexafluoroisopropylidene)diphthalic anhydride) was added to 61.5 g of N-methyl-2-pyrrolidone (NMP) and then, dissolved therein in a four-necked flask equipped with a stirrer, a thermostat, a nitrogen gas injector, and a condenser while nitrogen was passed through the flask. When the solid was completely dissolved, 3.27 g of SiDA ([bis(3-aminopropyl)]polydimethylsiloxane) [PAM-E, Shin-Etsu Chemical Co., Ltd.] was added thereto, and the obtained mixture was stirred at ambient temperature for 2 hours. After increasing a temperature up to 90° C., 7.96 g of pyridine and 5.14 g of acetic anhydride ($Ac_2O$) were added thereto, and the obtained mixture was stirred for 3 hours. After the temperature down to ambient temperature, 0.33 g of 2-hydroxyethyl methacrylate (HEMA) was added thereto, and the obtained mixture was stirred for 6 hours. The reaction mixture was added to water, and a precipitate produced therein was filtered, sufficiently washed with water, and dried at 50° C. under a reduced pressure for greater than or equal to 24 hours to obtain a binder polymer including a structural unit represented by Chemical Formula 9. A weight average molecular weight of the binder polymer was 13,800 g/mol when measured by GPC (Gel Permeation Chromatography) in terms of standard polystyrene, and polydispersity of the binder polymer was 1.86.

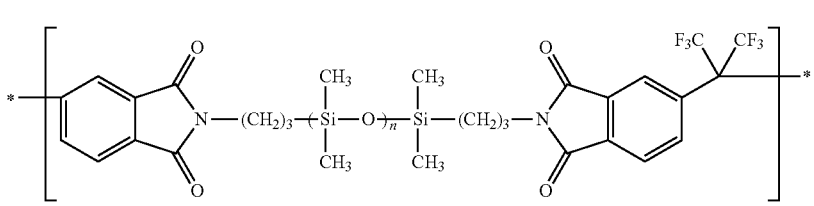

In Chemical Formula 9, n is 1.

Synthesis Example 4

6.04 g of PMDA (pyromellitic dianhydride) was added to 61.5 g of N-methyl-2-pyrrolidone (NMP) and then, dissolved therein in a four-necked flask equipped with a stirrer a thermostat, a nitrogen gas injector, and a condenser while nitrogen was passed through the flask. When the solid was completely dissolved, 5.29 g of SiDA ([bis(3-aminopropyl)]polydimethylsiloxane) [PAM-E, Shin-Etsu Chemical Co., Ltd.] was added thereto, and the obtained mixture was stirred at ambient temperature for 2 hours. After increasing a temperature up to 90° C., 3.89 g of pyridine and 2.51 g of acetic anhydride ($Ac_2O$) were added thereto, and the obtained mixture was stirred for 3 hours. After decreasing the temperature down to ambient temperature, 0.40 g of 2-hydroxyethylmethacrylate (HEMA) was added thereto, and the obtained mixture was stirred for 6 hours. Subsequently, 4.51 g of APAF (2,2-bis(3-amino-4-hydroxyphenyl) hexafluoropropane) was added thereto, and the obtained mixture was reacted for 6 hours, completing the reaction. The reaction mixture was added to water, and a precipitate produced therein was filtered, sufficiently washed with water, and dried at 50° C. under a reduced pressure for greater than or equal to 24 hours to obtain a binder polymer including a structural unit represented by Chemical Formula 11. A weight average molecular weight of the binder polymer was 11,800 g/mol when measured by GPC (Gel Permeation Chromatography) in terms of standard polystyrene, and polydispersity of the binder polymer was 2.80.

[Chemical Formula 11]

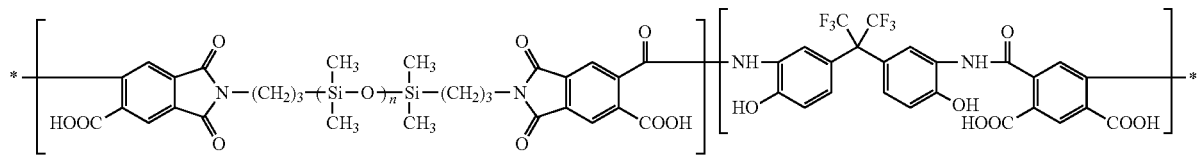

In Chemical Formula 11, n is 1.

Synthesis Example 5

12.3 g of 6-FDA (4,4'-(hexafluoroisopropylidene)diphthalic anhydride) was added to 61.5 g of N-methyl-2-pyrrolidone (NMP) and then, dissolved therein in a four-necked flask equipped with a stirrer, a thermostat, a nitrogen gas injector, and a condenser, while nitrogen was passed through the flask. When the solid was completely dissolved, 1.20 g of 2-hydroxyethylmethacrylate (HEMA) and 10.22 g of pyridine were added thereto, and the mixture was stirred for 2 hours. Then, 1.40 g of DAB (3,5-diaminobenzoic acid) was added thereto, and the obtained mixture was stirred at ambient temperature for 1 hour, 3.47 g of SiDA ([bis(3-aminopropyl)]polydimethylsiloxane) [PAM-E, Shin-Etsu Chemical Co., Ltd.] was added thereto, and the obtained mixture was stirred at ambient temperature for 2 hours. After increasing a temperature up to 90° C., 6.12 g of acetic anhydride ($Ac_2O$) was added thereto, and the obtained mixture was reacted for 6 hours, completing the reaction. The reaction mixture was added to water, and a precipitate produced therein was filtered, sufficiently washed with water, and dried at 50° C. under a reduced pressure for greater than or equal to about 24 hours to obtain a binder polymer including a structural unit represented by Chemical Formula 12. A weight average molecular weight of the binder polymer was 5,800 g/mol when measured by GPC (Gel Permeation Chromatography) in terms of standard polystyrene, and polydispersity of the binder polymer was 2.29.

[Chemical Formula 12]

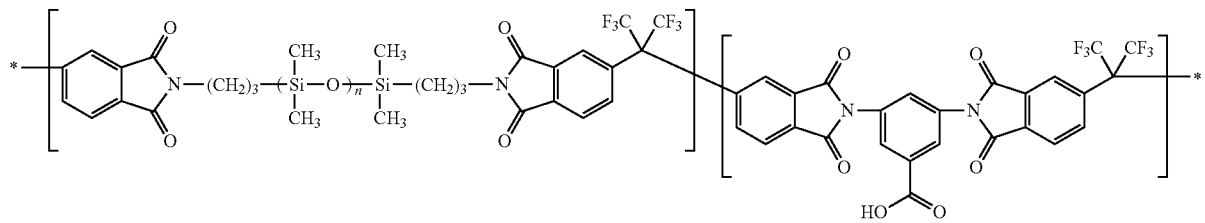

In Chemical Formula 12, n is 1.

Comparative Synthesis Example 1

12.3 g of 6-FDA (4,4'-(hexafluoroisopropylidene)diphthalic anhydride) was added to 86.6 g of N-methyl-2-pyrrolidone (NMP) and then, dissolved therein in a four-necked flask equipped with a stirrer, a thermostat, a nitrogen gas injector, and a condenser while nitrogen was passed through the flask. When the solid was completely dissolved, 3.25 g of 3-aminophenyl sulfone (3-DAS) was added thereto, and the obtained mixture was stirred at ambient temperature for 2 hours. After increasing a temperature up to 90° C., 5.6 g of pyridine and 2.05 g of acetic anhydride ($Ac_2O$) were added thereto, and the obtained mixture was stirred for 3 hours. After decreasing the temperature down to ambient temperature, 1.6 g of 2-hydroxyethylmethacrylate (HEMA) was added thereto, and the obtained mixture was stirred for 6 hours. Subsequently, 3.25 g of 3-aminophenyl sulfone (3-DAS) was added thereto, and the obtained mixture was reacted for 6 hours, completing the reaction. The reaction mixture was added to water, and a precipitate produced therein was filtered, sufficiently washed with water, and dried at 50° C. under a reduced pressure for greater than or equal to 24 hours to prepare a binder polymer including a structural unit represented by Chemical Formula X. A weight average molecular weight of the binder polymer was 7,800 g/mol when measured by GPC (Gel Permeation Chromatography) in terms of standard polystyrene, and polydispersity of the binder polymer was 1.8.

[Chemical Formula X]

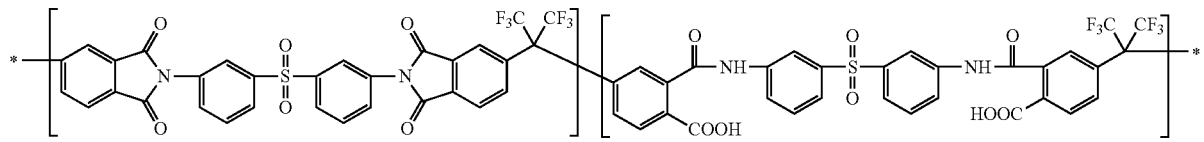

(Preparation of Photosensitive Resin Composition)

Examples 1 to 9 and Comparative Examples 1 and 2

A photopolymerization initiator was dissolved in a solvent to have a composition shown in Table 1, and the solution was stirred at ambient temperature for 2 hours. Herein, a binder polymer and a photopolymerizable monomer were added thereto, and the mixture was stirred at ambient temperature for 1 hour. Then, a surfactant (other additives) and a black colorant were added thereto, the obtained mixture was stirred for 1 hour at ambient temperature, and a solution obtained therefrom was entirely stirred for 2 hours. The solution was filtered three times to remove impurities and prepare each photosensitive resin composition.

(E) Solvent
Propylene glycol monomethyl ether acetate (PGMEA, Sigma-Aldrich Corporation)

(F) Other Additives
Fluorine surfactant (F-554, DIC Co., Ltd.)

Evaluation

The photosensitive resin compositions according to Examples 1 to 9 and Comparative Examples 1 and 2 were respectively spin-coated at 300 rpm on a glass substrate with K-SPINNER made by SEMES to form each resin coating layer. Subsequently, the coated substrates were dried (prebaked) on a 100° C. hot plate for 100 seconds to have a thickness of 1.5 μm. Then, the resin coating layers were exposed by radiating an actinic energy ray such as an ultraviolet (UV) ray and the like within energy intensity of 100 mJ/cm² through a mask (a gap: 100 μm). The exposed layers were developed in a developing solution (a 0.048%

TABLE 1

| | | (unit: g) | | | | | | | | | | |
|---|---|---|---|---|---|---|---|---|---|---|---|---|
| | | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 |
| (A) binder polymer | (A1) | 3.0 | — | — | — | — | 12.0 | — | — | — | — | — |
| | (A-2) | — | 3.0 | — | — | — | — | 12.0 | — | — | — | — |
| | (A-3) | — | — | 3.0 | — | — | — | — | 12.0 | — | — | — |
| | (A-4) | — | — | — | 3.0 | — | — | — | — | 12.0 | — | — |
| | (A-5) | — | — | — | — | 3.0 | — | — | — | — | — | — |
| | (A-6) | — | — | — | — | — | — | — | — | — | — | 3.0 |
| | (A-7) | 9.0 | 9.0 | 9.0 | 9.0 | 9.0 | — | — | — | — | 12.0 | 9.0 |
| (B) black colorant | | 20.0 | 20.0 | 20.0 | 20.0 | 20.0 | 20.0 | 20.0 | 20.0 | 20.0 | 20.0 | 20.0 |
| (C) photopolymerizable monomer | | 8.0 | 8.0 | 8.0 | 8.0 | 8.0 | 8.0 | 8.0 | 8.0 | 8.0 | 8.0 | 8.0 |
| (D) photopolymerization initiator | | 2.0 | 2.0 | 2.0 | 2.0 | 2.0 | 2.0 | 2.0 | 2.0 | 2.0 | 2.0 | 2.0 |
| (E) solvent | | 57.5 | 57.5 | 57.5 | 57.5 | 57.5 | 57.5 | 57.5 | 57.5 | 57.5 | 57.5 | 57.5 |
| (F) other additives | | 0.5 | 0.5 | 0.5 | 0.5 | 0.5 | 0.5 | 0.5 | 0.5 | 0.5 | 0.5 | 0.5 |

(A) Binder Polymer
(A-1) Binder polymer of Synthesis Example 1
(A-2) Binder polymer of Synthesis Example 2
(A-3) Binder polymer of Synthesis Example 3
(A-4) Binder polymer of Synthesis Example 4
(A-5) Binder polymer of Synthesis Example 5
(A-6) Binder polymer of Comparative Synthesis Example 1
(A-7) Cardo binder resin (V259ME, Nippon Steel Corporation)

(B) Black Colorant
Lactam organic black pigment dispersion liquid (CI-IM-126, SAKATA Corp.; Solid content of organic black pigment: 15 wt %)

(C) Photopolymerizable Monomer
Dipentaerythritol hexa(meth)acrylate (DPHA, Nippon Kayaku Co. Ltd.)

(D) Photopolymerization Initiator
Oxime initiator (NCI-831, ADEKA Corp.)

KOH aqueous solution, 23° C., 120 seconds) to form a curing layer pattern. Then, the patterned layers were put in a 380° C. convection oven and post-baked for 1 hour.

(1) Development-starting time was obtained by judging when the photosensitive resin compositions respectively started to be developed and patterned after coating-prebaking-exposure the photosensitive resin compositions respectively on glass substrates with naked eyes, and the results are shown in Table 2.

(2) An i-line exposer (i10c) was used during the exposure to realize a 5 μm isolated line pattern. Subsequently, the exposed coating layers were post-baked in a 380° C. convection oven for 1 hour, and then, their taper angles were measured by using a scanning electron microscope (S-4300 FE-SEM equipment, Hitachi Ltd.), and the results are shown in Table 2.

(3) A TGA analysis about the photosensitive resin compositions was performed to obtain a 1 wt % loss temperature, and the results are shown in Table 2.

TABLE 2

|  | Development starting time (sec) | Taper angle (°) | 1 wt % loss temperature (° C.) |
|---|---|---|---|
| Example 1 | 33 | 35 | 373 |
| Example 2 | 27 | 42 | 365 |
| Example 3 | 39 | 38 | 359 |
| Example 4 | 35 | 33 | 376 |
| Example 5 | 55 | 47 | 368 |
| Example 6 | 41 | 42 | 370 |
| Example 7 | 44 | 33 | 372 |
| Example 8 | 42 | 48 | 380 |
| Example 9 | 28 | 29 | 352 |
| Comparative Example 1 | 60 | 72 | 250 |
| Comparative Example 2 | 58 | 52 | 273 |

Referring to Table 2, the photosensitive resin compositions according to Examples 1 to 9 that included a binder polymer including the structural unit represented by Chemical Formula 1 exhibited excellent heat resistance as well as fast development starting time and clearly improved and large linearity on the interface of a pattern shape compared with a photosensitive resin composition including a binder polymer not including the structural unit.

By way of summation and review, a photosensitive resin film may be mainly formed of a black photosensitive resin composition. For example, the photosensitive resin layer such as a pixel defining layer and the like used as a material for a display device panel should have a small taper angle to secure processability and device reliability. In addition, a colorant such as a pigment, a dye, or the like absorbing light in a visible ray region may be used in order to help secure light-blocking properties.

Polyimide, polybenzoxazole, or a precursor thereof may be used as a binder resin or polymer of a photosensitive resin composition in order to obtain heat resistance, sensitivity, or low out-gas characteristics. A contrast ratio and sensitivity may be decreased and a taper angle may be increased during pattern formation after exposure.

The embodiments may provide a photosensitive resin composition for a black pixel defining layer capable of addressing the above-described issues.

The embodiments may provide a photosensitive resin composition having a low taper and excellent heat resistance.

A photosensitive resin composition according to an embodiment may have a fast development-starting time and excellent heat resistance as well as maintain a low taper angle and thus excellent workability and resultantly, may make it possible to form precise pixels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:
    a binder polymer including a structural unit represented by Chemical Formula 1, a structural unit represented by any one of Chemical Formula 3 to Chemical Formula 5, and a functional group represented by any one of Chemical Formula 8-1 to Chemical Formula 8-4 at each of two terminal ends;
    a black colorant;
    a photopolymerizable monomer;
    a photopolymerization initiator; and
    a solvent,

[Chemical Formula 1]

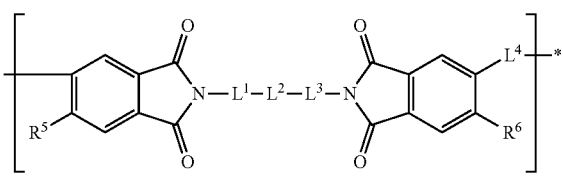

wherein, in Chemical Formula 1, $L^1$, $L^3$, and $L^4$ are each independently *—C(=O)—*, a substituted or unsubstituted C1 to C20 alkylene group, or a substituted or unsubstituted C6 to C20 arylene group, $L^2$ is a linking group represented by Chemical Formula 2, and $R^5$ and $R^6$ are each independently a hydrogen atom or a carboxyl group,

[Chemical Formula 2]

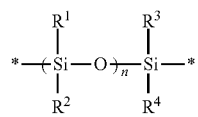

wherein, in Chemical Formula 2, $R^1$ to $R^4$ are each independently a substituted or unsubstituted C1 to C20 alkyl group or a substituted or unsubstituted C6 to C20 aryl group, and n is an integer of 1 to 10,

[Chemical Formula 3]

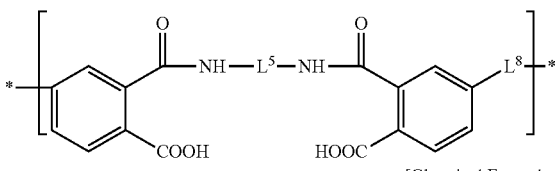

[Chemical Formula 4]

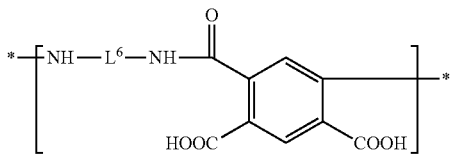

-continued

[Chemical Formula 5]

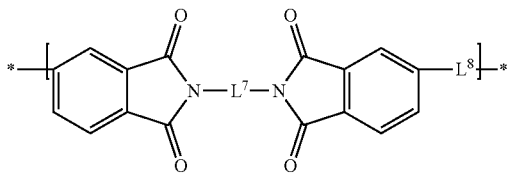

wherein, in Chemical Formula 3 to Chemical Formula 5, $L^5$ to $L^7$ are each independently a linking group represented by Chemical Formula 6 or Chemical Formula 7, and $L^8$ is *—C(=O)—* or a substituted or unsubstituted C1 to C20 alkylene group,

[Chemical Formula 6]

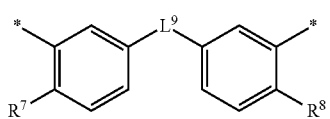

[Chemical Formula 7]

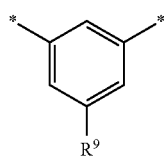

wherein, in Chemical Formula 6 and Chemical Formula 7, $L^9$ is *—S(=O)$_2$—* or *—C(CF$_3$)$_2$—*, $R^7$ and $R^8$ are hydrogen or a hydroxy group, and $R^9$ is a hydroxy group or a carboxyl group, provided that:

when $L^9$ is *—S(=O)$_2$—*, $R^7$ and $R^8$ are each hydrogen, and when $L^9$ is *—C(CF$_3$)$_2$—*, $R^7$ and $R^8$ are each a hydroxyl group,

[Chemical Formula 8-1]

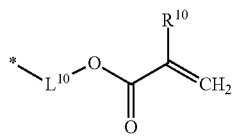

[Chemical Formula 8-2]

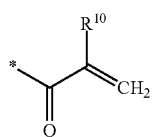

[Chemical Formula 8-3]

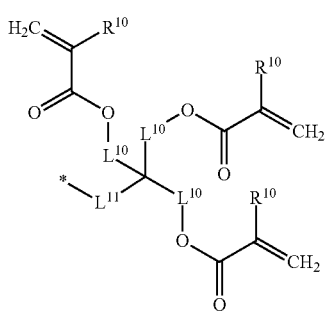

[Chemical Formula 8-4]

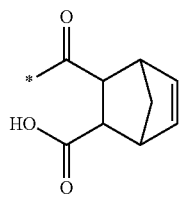

wherein, in Chemical Formula 8-1 to Chemical Formula 8-4, $L^{10}$ and $L^{11}$ are each independently a substituted or unsubstituted C1 to C10 alkylene group, $R^{10}$ is a hydrogen atom or a substituted or unsubstituted C1 to C10 alkyl group, and

* is a binding site.

2. The photosensitive resin composition as claimed in claim 1, wherein:

$L^1$ and $L^3$ are each independently an unsubstituted C1 to C20 alkylene group or an unsubstituted C6 to C20 arylene group, $L^4$ is a C1 to C20 alkylene group substituted with a trifluoromethyl group, and $R^5$ and $R^6$ are each a hydrogen atom.

3. The photosensitive resin composition as claimed in claim 1, wherein:

$L^1$ and $L^3$ are each independently an unsubstituted C1 to C20 alkylene group or an unsubstituted C6 to C20 arylene group, $L^4$ is *—C(=O)—*, and $R^5$ and $R^6$ are each a carboxyl group.

4. The photosensitive resin composition as claimed in claim 1, wherein the binder polymer includes a structural unit represented by one of Chemical Formula 10 to Chemical Formula 12:

[Chemical Formula 10]

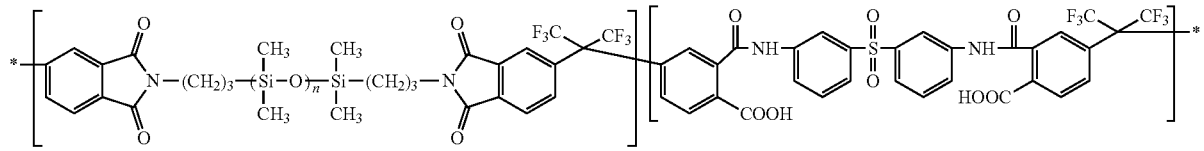

[Chemical Formula 11]

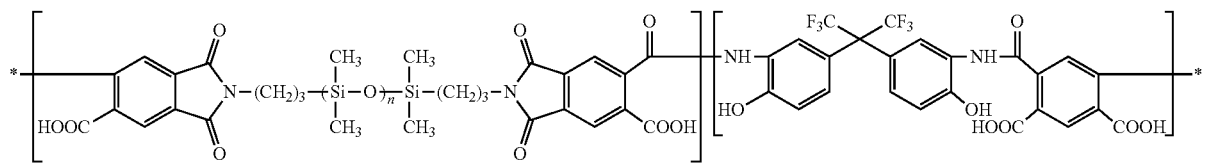

[Chemical Formula 12]

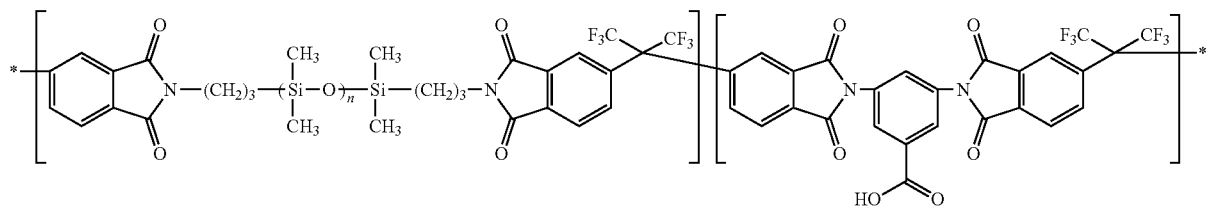

wherein, in Chemical Formula 10 to Chemical Formula 12, n is an integer of 1 to 10.

5. The photosensitive resin composition as claimed in claim 1, wherein the binder polymer has a weight average molecular weight of about 5,000 g/mol to about 20,000 g/mol.

6. The photosensitive resin composition as claimed in claim 1, wherein the photosensitive resin composition further includes a cardo binder resin.

7. The photosensitive resin composition as claimed in claim 1, wherein the black colorant includes an inorganic black pigment, an organic black pigment, or a combination thereof.

8. The photosensitive resin composition as claimed in claim 1, wherein the photopolymerizable monomer includes a compound including at least two functional groups represented by Chemical Formula 13:

[Chemical Formula 13]

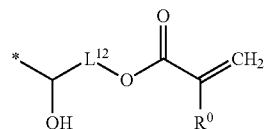

wherein, in Chemical Formula 13,
$R^0$ is a hydrogen atom or a substituted or unsubstituted C1 to C10 alkyl group,
$L^{12}$ is a single bond or a substituted or unsubstituted C1 to C10 alkylene group, and
\* is a binding site.

9. The photosensitive resin composition as claimed in claim 8, wherein the compound including at least two functional groups represented by Chemical Formula 13 is a compound represented by Chemical Formula 13-1 or Chemical Formula 13-2:

[Chemical Formula 13-1]

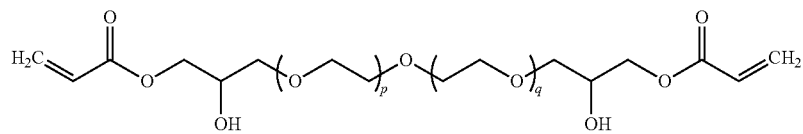

-continued

[Chemical Formula 13-2]

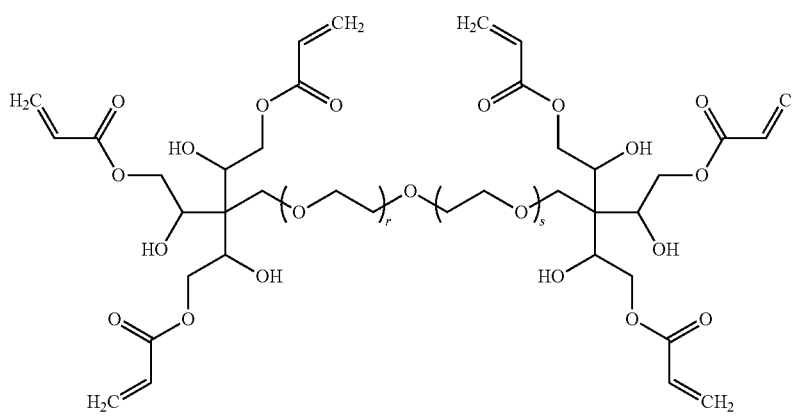

wherein, in Chemical Formula 13-1 and Chemical Formula 13-2, p, q, r, and s are each independently an integer of 1 to 10.

10. The photosensitive resin composition as claimed in claim 8, wherein the compound including at least two functional groups represented by Chemical Formula 13 is a compound represented by Chemical Formula 13-2:

[Chemical Formula 13-2]

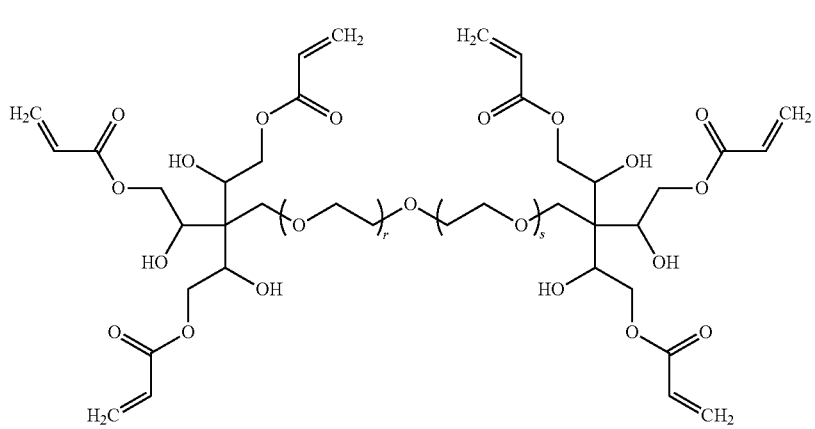

wherein, in Chemical Formula 13-2, r and s are each independently an integer of 1 to 10.

11. The photosensitive resin composition as claimed in claim 1, wherein the photosensitive resin composition includes:
about 1 wt % to about 30 wt % of the binder polymer;
about 1 wt % to about 25 wt % of the black colorant;
about 0.5 wt % to about 20 wt % of the photopolymerizable monomer;
about 0.1 wt % to about 5 wt % of the photopolymerization initiator; and
the solvent, all wt % being based on a total weight of the photosensitive resin composition.

12. The photosensitive resin composition as claimed in claim 1, wherein the photosensitive resin composition further includes malonic acid, 3-amino-1,2-propanediol, a silane-based coupling agent, a surfactant, a radical polymerization initiator, or a combination thereof.

13. A black pixel defining layer manufactured using the photosensitive resin composition as claimed in claim 1.

14. A display device comprising the black pixel defining layer as claimed in claim 13.

15. The display device as claimed in claim 14, wherein the display device is an organic light emitting diode (OLED) display device.

* * * * *